(12) United States Patent
Hein et al.

(10) Patent No.: US 12,429,503 B2
(45) Date of Patent: Sep. 30, 2025

(54) SENSOR INTEGRATED CIRCUIT WITH CURRENT OUTPUT CALIBRATION

(71) Applicant: Allegro MicroSystems, LLC, Manchester, NH (US)

(72) Inventors: Matthew Hein, Dallas, TX (US); Michael C. Doogue, Bedford, NH (US); William P. Taylor, Amherst, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 313 days.

(21) Appl. No.: 18/354,709

(22) Filed: Jul. 19, 2023

(65) Prior Publication Data

US 2025/0027975 A1 Jan. 23, 2025

(51) Int. Cl.
*G01R 15/04* (2006.01)
*G01R 15/20* (2006.01)
*G01R 35/00* (2006.01)

(52) U.S. Cl.
CPC ............. *G01R 15/20* (2013.01); *G01R 15/04* (2013.01); *G01R 35/005* (2013.01)

(58) Field of Classification Search
CPC ....... G01R 15/20; G01R 15/04; G01R 35/005
See application file for complete search history.

(56) References Cited

U.S. PATENT DOCUMENTS

| | | | |
|---|---|---|---|
| 8,054,071 B2 | 11/2011 | Doogue et al. | |
| 8,122,159 B2 | 2/2012 | Monreal | |
| 9,621,140 B1 | 4/2017 | Fernandez et al. | |
| 10,725,122 B2 | 7/2020 | Rubinsztain et al. | |
| 2023/0076801 A1* | 3/2023 | Braunstein | G05F 3/205 |

OTHER PUBLICATIONS

LEM International SA Datasheet "Current Transducer LF 310-S/ SPA5, $I_{PN}$=300 A", Dec. 21, 2020, 7 pages.

* cited by examiner

*Primary Examiner* — Alesa Allgood
(74) *Attorney, Agent, or Firm* — DALY, CROWLEY, MOFFORD & DURKEE, LLP (57) ABSTRACT

A sensor integrated circuit configured to generate a sensor output current indicative of a sensed parameter includes a power connection to receive a supply voltage, a ground connection, a sensing circuit configured to generate a parameter current proportional to the sensed parameter, and an output connection at which the sensor output current is provided. An output current calibration circuit is configured to determine an offset current that corresponds to a bias voltage at the output connection equal to a fixed percentage of the supply voltage when the parameter current is substantially zero. The sensor output current is provided as a combination of the parameter current and the offset current.

25 Claims, 3 Drawing Sheets

SENSOR INTEGRATED CIRCUIT WITH CURRENT OUTPUT CALIBRATION

BACKGROUND

As is known, sensors are used to perform various functions in a variety of applications. Some sensors include one or more magnetic field sensing elements, such as a Hall effect element or a magnetoresistance (MR) element, to sense a magnetic field associated with a target object. Magnetic field sensor applications, include, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a linear magnetic field sensor that senses a magnetic field strength or density of a magnetic field.

The sensor output signal can be provided in various formats. For example, some sensors communicate with an external controller with a two-wire, digital, current level protocol with which the power connections to the sensor are used to communicate data by applying discrete current levels to the power connections.

Other sensors communicate with an external controller through a three-wire interface in which a dedicated connection is provided to communicate data as a voltage level that can be proportional to the sensed parameter.

Still other sensors, such as current transducers, provide an output signal in the form of an analog current level (i.e., a current output signal that is proportional to a sensed parameter). The analog current level can be converted into a voltage at the external controller by a so-called "burden resistor" for interpretation of the sensed parameter.

Providing sensors with fewer external connections, or pins, without sacrificing functionality can be advantageous due to tight space constraints in many electronic systems and/or can permit additional functionality requiring an external connection to be implemented. Furthermore, additional pins can increase the overall cost of the sensor due to a larger semiconductor package required In some systems, the sensor is located at a relatively long distance from the system controller. Depending on the length of the connection and external factors, voltage signals can be more susceptible to noise pick-up than current signals. Furthermore, noise susceptibility can be especially problematic in high current switching applications, such as where current sensors are commonly used.

Although an analog current output signal can advantageously be less susceptible to noise pick-up than a digital output signal, such an analog current output normally requires an additional connection in order to bias the burden resistor in certain applications. In applications in which the sensor senses a parameter with positive and negative values (i.e., a bi-directional sensor or output), a zero-output voltage bias needs to be applied to the burden resistor in order to render the interpreted current independent of the resistance of the burden resistor (i.e., to set the zero point of the sensor output signal).

SUMMARY

The present disclosure includes circuits and methods for providing a sensor with an analog current output in a manner that requires only a single output connection, that is independent of the resistance of the burden resistor, and that permits bi-directional sensing (i.e., sending a parameter having positive and negative values). The burden resistance is effectively measured by calibrating the sensor to determine an offset current to be applied at the sensor output during operation. The offset current corresponds to a bias voltage at the sensor output connection equal to a fixed percentage of the supply voltage when a parameter current is substantially zero.

According to the disclosure, a sensor integrated circuit configured to generate a sensor output current indicative of a sensed parameter includes a power connection configured to receive a supply voltage, a ground connection, a sensing circuit configured to generate a parameter current proportional to the sensed parameter, and an output connection at which the sensor output current is provided. An output current calibration circuit is configured to determine an offset current that corresponds to a bias voltage at the output connection equal to a fixed percentage of the supply voltage when the parameter current is substantially zero, wherein the sensor output current is a combination of the parameter current and the offset current.

Features may include one or more of the following individually or in combination with other features. The output current calibration circuit can include a voltage divider configured to generate a divided supply voltage equal to the fixed percentage of the supply voltage, an operational amplifier coupled to receive the divided supply voltage and a voltage at the output connection and to generate a difference voltage, and a voltage controlled current source responsive to the difference voltage and configured to generate the offset current. The output connection can be configured to be coupled to a resistor external to the integrated circuit. The resistor can be remotely located with respect to the sensor integrated circuit. The sensor integrated circuit can further include a memory configured to store a setting indicative of the offset current. The sensor integrated circuit can further include a memory configured to store information indicative of the supply voltage. The sensing circuit can include a sensing element configured to generate a sensor output signal, an amplifier coupled to receive the sensor output signal and configured to generate an amplifier output signal, and a voltage controlled current circuit responsive to the amplifier output signal and configured to generate the parameter current. The voltage controlled current circuit can include a current source coupled between the supply voltage and the output connection and a current sink coupled between the output connection and the ground connection. The sensing element can include a magnetic field sensing element and the sensed parameter is a magnetic field. The sensor integrated circuit can further include a circuit to check a level of the parameter current during operation of the output current calibration circuit. The sensing circuit can be disabled during operation of the output current calibration circuit. The bias voltage can be equal to one-half of the supply voltage.

Also described is a method for generating a sensor output current at an output connection of a sensor integrated circuit, including applying a supply voltage to the sensor integrated circuit, determining an offset current that corresponds to a bias voltage at the output connection equal to a fixed percentage of the supply voltage when a parameter current is substantially zero, generating the parameter current proportional to a sensed parameter, and providing the sensor output current at the output connection as a combination of the parameter current and the offset current.

Features may include one or more of the following individually or in combination with other features. Determining the offset current can include dividing the supply voltage to generate a divided supply voltage corresponding to the fixed percentage of the supply voltage, comparing the divided supply voltage to a voltage at the output connection to generate a difference voltage, and generating the offset current based on the difference voltage. The method can further include coupling the output connection to a resistor external to the integrated circuit. The method can further include storing the offset current. The method can further include checking a level of the parameter current and using the stored offset current to generate the sensor output current if the parameter current is greater than a predetermined level. The method can further include storing the supply voltage. The method can further include disabling the generation of the parameter current during the determination of the offset current. Generating a parameter current can include sensing the parameter with a sensing element to generate a sensor output signal, amplifying the sensor output signal to generate an amplifier output signal, and generating the parameter current with a voltage controlled current circuit based on the amplifier output signal. Generating the parameter current with a voltage controlled current circuit can include sourcing a current to the output connection or sinking a current from the output connection based on the amplifier output signal. Sensing the parameter with a sensing element can include sensing a magnetic field with a magnetic field sensing element. The fixed percentage of the supply voltage can be one-half.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Figure 1:
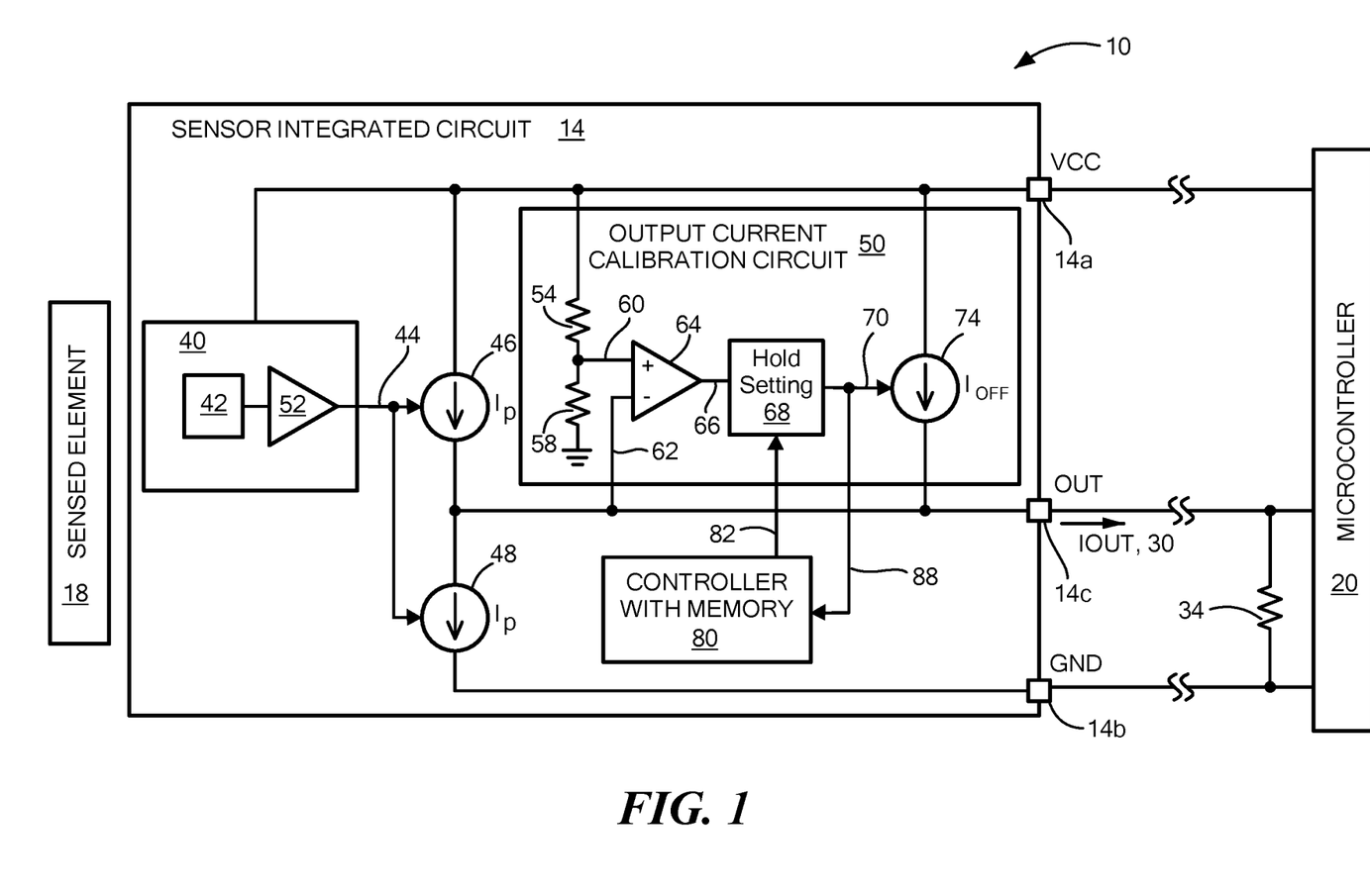
FIG. 1 shows a sensor integrated circuit with on-chip output current calibration according to the disclosure.

Referring to FIG. 1, a sensor system 10 includes a sensor integrated circuit (IC) 14 configured to generate a sensor output current Jour 30 indicative of a sensed parameter associated with a target object, or element 18. A sensing circuit 40 is configured to generate a parameter current $I_P$ that is proportional to the sensed parameter associated with element 18. The sensor 14 includes a power connection 14a to receive a supply voltage VCC, a ground connection 14b, and an output connection OUT 14c at which the sensor output current 30 is provided.

Sensing circuit 40 can take various forms. In example embodiments, the sensor 14 can be a magnetic field sensor and the sensing circuit 40 can include one or more magnetic field sensing elements 42. Other types of sensing circuits 40 are possible, such as can include one or more optical sensing elements, pressure sensing elements, or temperature sensing elements, as non-limiting examples.

The parameter associated with element 18 that is sensed by sensing circuit 40 can be a current through a current conductor element in the case of a current sensor 14 or a field strength associated with a ferromagnetic or permanent magnet target in the case of a linear sensor, as non-limiting examples. It will be appreciated that other parameters associated with other elements 18 are possible.

The sensing circuit 40 can include one or more sensing elements 42 configured to generate a sensor output signal and an amplifier 52 coupled to receive the sensor output signal and configured to generate an amplifier output signal 44. A voltage controlled current circuit is responsive to the amplifier output signal 44 and is configured to generate a parameter current. More particularly, the voltage controlled current circuit can include a current source 46 coupled between the supply voltage connection 14a and the output connection 14c and having a control connection responsive to the amplifier output signal 44 and a current sink 48 coupled between the output connection 14c and the ground connection 14b and having a control connection responsive to the amplifier output signal 44. At any given time, either current source 46 or current sink 48 is active to generate the parameter current $I_P$.

A controller, or microcontroller 20 external to the sensor 14 receives and interprets the sensor output current 30. To this end, a burden resistor 34 is coupled to the microcontroller 20 to convert the sensor output current 30 into a voltage for digitization and further processing by the microcontroller.

In applications, the microcontroller 20 and the burden resistor 34 can be remotely positioned with respect to the sensor integrated circuit 14. Lengthy signal connections can be susceptible to noise from other sources and providing the sensor output in the form of current 30 can provide some noise immunity as compared to an output voltage.

According to the disclosure, sensor 14 includes an output current calibration circuit 50 configured to determine an offset current $I_{OFF}$ that corresponds to a bias voltage at the output connection 14c equal to a fixed percentage of the supply voltage VCC when the parameter current $I_P$ is substantially zero. The described calibration circuitry and methods effectively measure the burden resistance without requiring an additional sensor connection by determining an offset current $I_{OFF}$ to be applied to the sensor output 14c during operation.

The current calibration circuit 50 operates to determine the offset current $I_{OFF}$ when the sensor 14 is powered on and before the parameter current $I_P$ is generated (e.g., before the sensing circuit 40 is enabled). Calibration can be performed with the sensor 14 in the application environment with the burden resistor 34 in place or alternatively can be performed in a manufacturing, or factory setting with a dummy burden resistor coupled to the sensor output 14c.

Figure 2:
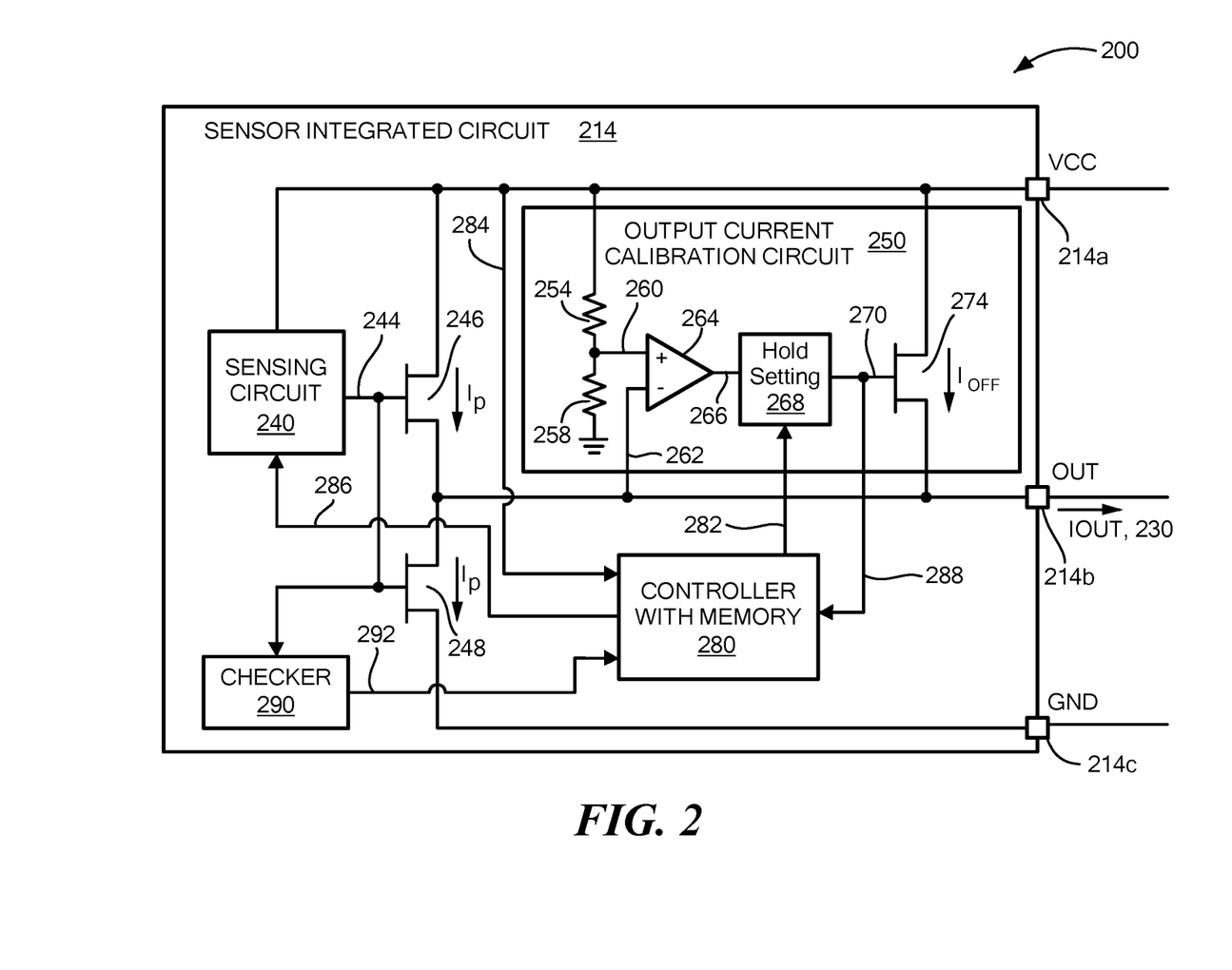
FIG. 2 shows a sensor integrated circuit with on-chip output current calibration and including additional features according to the disclosure.

The sensing circuit 40 can be disabled in various ways so as to prevent amplifier output signal 44 or parameter current $I_P$ from being generated during calibration. For example, power to the sensing circuit 40 (e.g., biasing of a Hall effect element 42) and/or the current source 46 and current sink 48 can be turned off or decoupled from the output 14c. The sensed element 18 can be controlled so as not to generate a sensor output signal 44. In the case of a current sensor system 10 in which the sensor IC 14 is configured to sense current through a conductor 18, the conductor itself can be decoupled from any source of current. Additionally or alternatively, a checker circuit can be used to measure the output of the sensing elements 42 directly or check the voltage controlled current source to make sure there is no output (e.g., as shown in FIG. 2).

With the parameter current $I_P$ at zero, the determined offset current $I_{OFF}$ is at whatever value is needed to ensure the fixed bias voltage on the burden resistor 34. Stated differently, the determined offset current $I_{OFF}$ is a current that provides a voltage on the output connection 14c at the fixed percentage of the supply voltage VCC (e.g., VCC/2).

More particularly, the output current calibration circuit 50 can include a voltage divider 54, 58 configured to generate a divided supply voltage 60 equal to the fixed percentage of the supply voltage and an operational amplifier 64 coupled to receive the divided supply voltage and a voltage 62 at the output connection 14c and to generate a difference voltage 66. In an example, the fixed percentage of the supply voltage is one-half of the supply voltage, or VCC/2. It will be appreciated by those of ordinary skill in the art that other fixed percentages of the supply voltage are possible. The difference voltage 66 represents a difference between the divided supply voltage 60 and the voltage 62 at the output connection 14c.

A circuit 68 can hold the difference voltage 66 and can provide a setting 70 to control a current source 74, such as a voltage controlled current source, with which an offset current $I_{OFF}$ is generated. Circuit 68 can be a sample and hold circuit to store the difference voltage 66 as an analog value or alternatively can digitize the output voltage 66 of the amplifier 64 and store the setting 70 as a digital word.

The stored setting 70 can control current source 74 with which the offset current $I_{OFF}$ is provided. In an example, the current source 74 is a voltage controlled current source, as may take the form of a MOSFET device, as shown in FIG. 2.

During operation of sensor 14 following calibration by the circuit 50, the calibration circuit 50 is disabled, the offset current $I_{OFF}$ is set to a constant current, and sensor output current $I_{OUT}$ 30 is generated as a combination of the parameter current $I_P$ and the offset current $I_{OFF}$. Disabling of the calibration circuit 50 and setting the offset current $I_{OFF}$ to a constant current can mean simply that the difference voltage 66 is held.

As noted above, at any given time, the parameter current $I_P$ is generated by either current source 46 or current sink 48 and thus, at the output connection 14c, the output current attributable to the sensed parameter can be a positive current or a negative current. The output current 30 can be expressed as the offset current $I_{OFF}$ plus or minus the parameter current $I_P$.

The burden resistor 34 can be selected and provided by an end-user in order to establish a desired full-scale range of the output signal centered around the fixed bias voltage level. In an example application, the parameter to be sensed can be a primary current through an external conductor or integrated conductor 18 having a range between +/−10 amps, which current range corresponds to a parameter current $I_P$ of +/−1 milliamp based on the sensor gain. With knowledge of the nominal supply voltage VCC, and a bias voltage of a fixed percentage of the supply voltage, such as one-half of the supply voltage, the end-user can select a burden resistor 34 so as to achieve a desired voltage range at the microcontroller 20. For example, with a supply voltage of 5.0 volts, a burden resistance of 2 Kohm can result in an offset current $I_{OFF}$ of 1.25 mA. In operation, the voltage across the 2 Kohm burden resistor will be +/−4.5 volts. In this way, the user can select the output full-scale range based on selection of the burden resistor 34 while still centering the output current $I_{OUT}$ around the fixed bias voltage (e.g., VCC/2) for a zero sensor reading.

The precise value of the burden resistor 34 can be unknown, for example due to tolerances and the burden resistor being provided by a customer or end-user of the sensor 14. However, it is important that microcontroller 20 receives an accurate voltage across the burden resistor 34 in order to ensure that the sensor output current 30 is accurately interpreted, as is ensured by the described arrangement.

A controller 80 can include memory and can be coupled to hold circuit 68 by a connection 82. Following calibration by calibration circuit 50, the setting 70 can be stored in memory 80 by a connection 88. For example, the setting 70 can be digitized with an ADC, stored in memory 80 and output on a DAC to control the voltage controlled current source 74. Memory 80 can take various forms including, but not limited to flash, EEPROM, and MRAM.

Under certain conditions, a setting can be preset or pre-programmed into memory 80 for use to control the offset current $I_{OFF}$ in place of the setting 70 generated by calibration circuit 50. For example, as explained in connection with FIG. 2 below, if the parameter current $I_P$ is at a level that is considered to prevent accurate calibration by circuit 50, a pre-programmed setting can be provided from memory 80 for use to control voltage controlled current source 74. As is also explained in connection with FIG. 2, under certain conditions, the supply voltage level can be stored in memory 80.

Referring also to FIG. 2, a sensor system 200 includes an example sensor 214 as may provide the sensor 14 of FIG. 1. Sensor 214 can thus, be the same or substantially similar to sensor 14, but with optional additional features including a checker circuit 290 and a connection 284, as will be described.

To this end, sensor 214 is configured to generate a sensor output current $I_{OUT}$ 230 indicative of a sensed parameter associated with a target object (not shown) and includes a sensing circuit 240 configured to generate a parameter current $I_P$ that is proportional to the sensed parameter. Sensor 214 includes a power connection 214a to receive a supply voltage VCC, a ground connection 214b, and an output connection OUT 214c at which the sensor output current 230 is provided. Sensing circuit 240 can be the same as or similar to sensing circuit 40 of FIG. 1.

The output signal 244 of the sensing circuit 240 can control a current source 246 and a current sink 248, only one (or neither) of which is active at any given time. In an example, current source 246 can take the form of an NMOS FET and current sink 248 can take the form of a PMOS FET.

A microcontroller (not shown) that is the same as or similar to microcontroller 20 (FIG. 1) can receive and interpret the sensor output current 230 and a burden resistor (not shown) that is the same as or similar to burden resistor 34 (FIG. 1) can be coupled to the microcontroller to convert the sensor output current 230 into a voltage for digitization and further processing.

An output current calibration circuit 250 can be the same as or similar to output current calibration circuit 50 (FIG. 1) and can be configured to determine an offset current $I_{OFF}$ that corresponds to a bias voltage at the output connection 214c equal to a fixed percentage of the supply voltage VCC when the parameter current $I_P$ is substantially zero, thereby effectively measuring the burden resistance without requiring an additional sensor connection by determining an offset current $I_{OFF}$ to be applied to the sensor output 214c during operation.

During calibration, the sensing circuit 240 can be disabled to prevent a parameter current $I_P$ from being generated. For example, a controller 280, that can be the same as or similar to controller 80 (FIG. 1), can generate a control signal 286 with which power to the sensing circuit 240 (e.g., biasing of a Hall effect element, or a magnetoresistance element or bridge of MR elements) is decoupled.

The output current calibration circuit 250 includes a voltage divider 254, 258 configured to generate a divided supply voltage 260 equal to the fixed percentage of the supply voltage and an operational amplifier 264 coupled to receive the divided supply voltage and a voltage 262 at the output connection 214c and to generate a difference voltage 266. In an example, the fixed percentage of the supply voltage is one-half of the supply voltage, or VCC/2. The difference voltage 266 represents a difference between the divided supply voltage 260 and the voltage at the output connection 214c.

Circuit 268 can be the same as or similar to circuit 68 (FIG. 1) and can hold the difference voltage 266 and provide a setting 270 to control a current source 274, such as a voltage controlled current source, with which an offset current $I_{OFF}$ is generated. Circuit 268 can be a sample and hold circuit to store the difference voltage 266 as an analog value or alternatively can digitize the output of the amplifier 264 and store the setting 270 as a digital word. Following calibration by calibration circuit 250, the setting 270 can be stored in memory 280 by a connection 288. For example, the setting 270 can be digitized with an ADC, stored in memory 280 and output on a DAC to control the voltage controlled current source 274. Memory 280 can take various forms including, but not limited to flash, EEPROM, and MRAM.

The stored setting 270 can control current source 274 with which the offset current $I_{OFF}$ is provided. In an example, the current source 274 is a voltage controlled current source, as may take the form of a MOSFET device, as shown.

During operation of sensor 214 following calibration by the circuit 250, the calibration circuit 250 is disabled and sensor output current $I_{OUT}$ 230 is generated as a combination of the parameter current $I_P$ and the offset current $I_{OFF}$. Disabling of the calibration circuit 250 can mean simply that the difference voltage 266 is held.

As noted above, at any given time, the parameter current $I_P$ is generated by either current source 246 or current sink 248 and thus, at the output connection 214c, the output current attributable to the sensed parameter can be a positive current or a negative current. The output current 230 can be expressed as the offset current $I_{OFF}$ plus or minus the parameter current $I_P$.

Under certain conditions, a setting can be preset or pre-programmed into memory 280 for use to control the offset current $I_{OFF}$ in place of the setting 270 generated by calibration circuit 250. For example, if the parameter current $I_P$ is at a level that is considered to prevent accurate calibration by circuit 250, a pre-programmed setting 270 can be provided from memory 280 for use to control voltage controlled current source 274.

To this end, sensor 214 can include a checker circuit 290 to compare a level of the parameter current $I_P$ to a threshold. In an example, the checker circuit 290 can be coupled to the control terminals of FETs 244, 246 to compare control voltages to respective thresholds in order to thereby determine conduction of the FETs and a level of current sourced by source 244 or sunk by sink 246. In this way, output signal 292 of checker 290 can indicate whether the parameter current $I_P$ is too high to accurately calibrate the sensor. If the parameter current $I_P$ is considered too high, then a pre-programmed setting stored in memory 280 can be applied via connection 282 in order to thereby establish the offset current $I_{OFF}$. Alternatively, if the parameter current $I_P$ is zero or close enough to zero to permit accurate calibration to be performed, then calibration circuit 250 can operate to determine the offset current $I_{OFF}$ as explained above.

It will be appreciated by those of ordinary skill in the art that while the checker circuit 290 is coupled to the control terminals of FETs 244, 246, alternative configurations for determining the parameter current $I_P$ are possible. By way of a non-limiting example, a resistor can be placed in series with the current source 244 and current sink 246 and the voltage across such resistor can be measured to determine a level of the parameter current $I_P$ for comparison to one or more thresholds.

Sensor 214 can include a connection 284 with which the supply voltage level VCC is stored in memory 280. In particular, the level of the supply voltage VCC at the time of calibration by circuit 250 can be stored. This functionality can be advantageous if, after calibration, the accuracy of the sensor output Iour degrades, in which case the stored supply voltage level can be used to determine if the applied supply voltage level has changed since calibration. For example, if the sensor 214 is installed in an application in which the supply voltage VCC is 5.0 volts and calibrated accordingly, and subsequently the supply voltage is changed, then the determined offset current $I_{OFF}$ will not be at a suitable level to generate an accurate output current $I_{OUT}$ that accurately reflects the sensed parameter. Knowing the supply voltage level that was applied during calibration can thus, be helpful in order to facilitate troubleshooting. This feature can be particularly useful in applications in which the sensor output is ratiometric (i.e., in which the sensor output varies with variations in the supply voltage). In the ratiometric case, the sensor may adjust the offset current $I_{OFF}$ ratiometrically as the VCC power supply changes during operation with respect to the default calibration settings of VCC and $I_{OFF}$. Further, a fault or flag pin may be used to indicate an error with the sensor.

Figure 3:
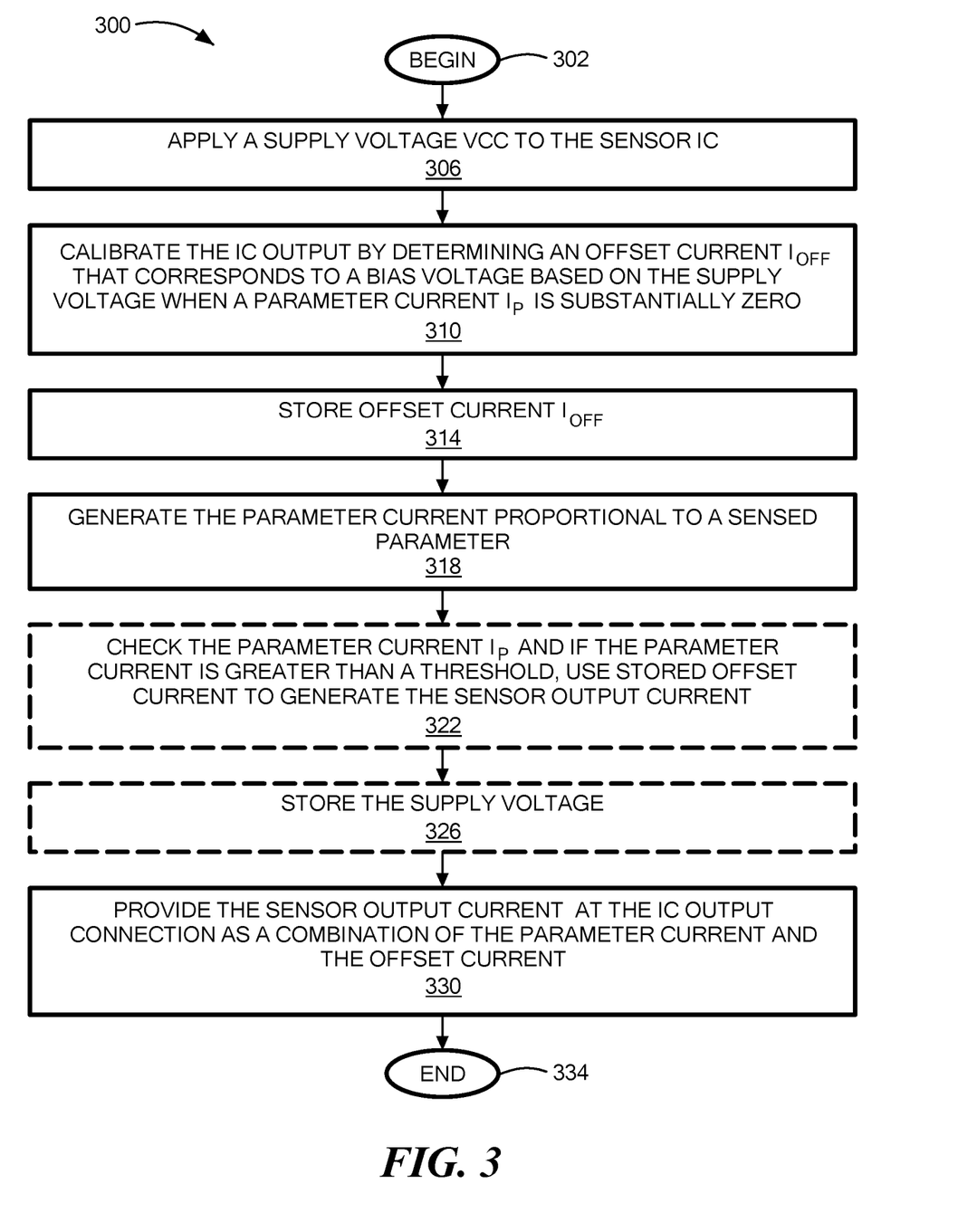
FIG. 3 is a flow diagram illustrating a method for calibrating a sensor integrated circuit output current according to the disclosure.

Referring also to FIG. 3, a flow diagram 300 illustrates a method for calibrating a sensor integrated circuit output current beginning at block 302 according to the disclosure. At block 306, a supply voltage VCC is applied to the sensor IC. For example, in the embodiment of FIG. 1, a supply voltage VCC can be applied between power connections 14a, 14b of the sensor IC 14.

At block 310, the IC output connection is calibrated by determining an offset current $I_{OFF}$ that corresponds to a bias voltage of a fixed percentage of the supply voltage when the parameter current $I_P$ is substantially zero. As explained above in connection with FIG. 1 for example, this determination can be achieved with the calibration circuit 50 by comparing a divided supply voltage 60 to the voltage at the output connection 14c to generate a difference voltage 66. At block 314, the offset current $I_{OFF}$ can be stored, such as by storing a setting 70 in memory 80 that corresponds to the difference voltage 66 with which current source 74 is controlled.

The parameter current $I_P$ can be generated at block 318. For example, the parameter current $I_P$ can be generated by a sensing element (e.g., element 42, FIG. 1) configured to generate a sensor output signal and an amplifier (e.g., amplifier 52, FIG. 1) with which the sensor output signal is amplified. A voltage controlled current circuit (e.g., as may include a current source 44 and current sink 46, FIG. 1) can be responsive to the amplifier output signal to generate a parameter current $I_P$.

At an optional block 322, the parameter current $I_P$ can be checked to determine if it is greater than a threshold and, if the parameter current $I_P$ is greater than the threshold, then a stored setting can be used to generate the offset current $I_{OFF}$ for use in providing the sensor output current $I_{OUT}$. For example, as explained in connection with FIG. 2, a checker 290 can generate an output signal 292 indicative of whether the parameter current $I_P$ is too high to accurately calibrate the sensor. If the parameter current $I_P$ is considered too high, then a preprogrammed setting stored in memory 280 can be used to establish the offset current $I_{OFF}$. Alternatively, if the parameter current $I_P$ is zero or close enough to zero to permit accurate calibration to be performed, then calibration circuit 250 can operate to determine the offset current $I_{OFF}$.

At a further optional block 326, the supply voltage level VCC can be stored. As explained above in connection with FIG. 2, knowing the supply voltage level during calibration can facilitate troubleshooting under conditions in which the supply voltage is changed after calibration.

At block 330, the sensor output current $I_{OUT}$ can be generated at the output connection (e.g., output 14c, FIG. 1) as a combination of the parameter current $I_P$ and the offset current $I_{OFF}$, following which the method ends at block 334. For example, the output current $I_{OUT}$ can be expressed as the offset current $I_{OFF}$ plus or minus the parameter current $I_P$.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

As used herein, the term "sensor" is used to describe a circuit that uses one or more sensing elements, generally in combination with other circuits. For example, the sensor can be a magnetic field sensor with one or more magnetic field sensing elements. The magnetic field sensor can be, for example, a rotation detector, a movement detector, or a proximity detector. A linear sensor can sense a magnetic field strength. A rotation detector (or movement detector) can senses passing target objects, for example, magnetic domains of a ring magnet or a ferromagnetic target (e.g., gear teeth) where the magnetic field sensor is used in combination with a back-bias or other magnet and can determine target movement speed. Also, linear arrangements of ferromagnetic objects are possible that move linearly.

As used herein, the term "magnetic field sensing element" is used to describe a variety of electronic elements that can sense a magnetic field. The magnetic field sensing element can be, but is not limited to, a Hall effect element, a magnetoresistance element, a magnetotransistor, or an inductive coil. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate or in the plane of the substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of maximum sensitivity perpendicular to a substrate, while metal based or metallic magnetoresistance elements (e.g., GMR, TMR, AMR) and vertical Hall elements tend to have axes of maximum sensitivity parallel to a substrate.

As used herein, the term "magnetic field signal" is used to describe any signal that results from a magnetic field experienced by a magnetic field sensing element.

As used herein, the terms "processor" and "controller" are used to describe elements that perform a function, an operation, or a sequence of operations. The function, operation, or sequence of operations can be hard coded into an electronic circuit or soft coded by way of instructions held in a memory device. The function, operation, or sequence of operations can be performed using digital values or using analog signals. In some embodiments, the processor or controller can be embodied in an application specific integrated circuit (ASIC), which can be an analog ASIC or a digital ASIC, in a microprocessor with associated program memory, in a discrete electronic circuit which can be analog or digital, and/or in special purpose logic circuitry (e.g., a field programmable gate array (FPGA)). Processing can be implemented in hardware, software, or a combination of the two. Processing can be implemented using computer programs executed on programmable computers/machines that include one or more processors, a storage medium or other article of manufacture that is readable by the processor (including volatile and non-volatile memory and/or storage elements), at least one input device and one or more output devices. Program code can be applied to data entered using an input device to perform processing and to generate output information. A processor or controller can contain internal processors or modules that perform portions of the function, operation, or sequence of operations. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

It should be understood that a so-called "comparator" can be comprised of an analog comparator having a two-state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, that includes a list of elements is not necessarily limited to only those elements but can include other elements not expressly listed or inherent to such apparatus, method, composition, mixture, or article.

References in the specification to "embodiments," "one embodiment," "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

In the foregoing detailed description, various features of embodiments are grouped together in one or more individual embodiments for the purpose of streamlining the disclosure. This method of disclosure is not to be interpreted as reflecting an intention that the claims require more features than are expressly recited therein. Rather, inventive aspects may lie in less than all features of each disclosed embodiment.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

Having described preferred embodiments of the present disclosure, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A sensor integrated circuit configured to generate a sensor output current indicative of a sensed parameter, comprising:
   a power connection configured to receive a supply voltage;
   a ground connection;
   a sensing circuit configured to generate a parameter current proportional to the sensed parameter;
   an output connection at which the sensor output current is provided; and
   an output current calibration circuit configured to determine an offset current that corresponds to a bias voltage at the output connection equal to a fixed percentage of the supply voltage when the parameter current is substantially zero, wherein the sensor output current is a combination of the parameter current and the offset current.

2. The sensor integrated circuit of claim 1 wherein the output current calibration circuit comprises:
   a voltage divider configured to generate a divided supply voltage equal to the fixed percentage of the supply voltage;
   an operational amplifier coupled to receive the divided supply voltage and a voltage at the output connection and to generate a difference voltage; and
   a voltage controlled current source responsive to the difference voltage and configured to generate the offset current.

3. The sensor integrated circuit of claim 1 wherein the output connection is configured to be coupled to a resistor external to the integrated circuit.

4. The sensor integrated circuit of claim 3 wherein the resistor is remotely located with respect to the sensor integrated circuit.

5. The sensor integrated circuit of claim 1 further comprising a memory configured to store a setting indicative of the offset current.

6. The sensor integrated circuit of claim 1 further comprising a memory configured to store information indicative of the supply voltage.

7. The sensor integrated circuit of claim 1 wherein the sensing circuit comprises:
   a sensing element configured to generate a sensor output signal;
   an amplifier coupled to receive the sensor output signal and configured to generate an amplifier output signal; and
   a voltage controlled current circuit responsive to the amplifier output signal and configured to generate the parameter current.

8. The sensor integrated circuit of claim 7 wherein the voltage controlled current circuit comprises a current source coupled between the supply voltage and the output connection and a current sink coupled between the output connection and the ground connection.

9. The sensor integrated circuit of claim 8 wherein the sensing element comprises a magnetic field sensing element and the sensed parameter is a magnetic field.

10. The sensor integrated circuit of claim 9 wherein the magnetic field is generated by a current flow through a primary current conductor.

11. The sensor integrated circuit of claim 1 further comprising a circuit to check a level of the parameter current during operation of the output current calibration circuit.

12. The sensor integrated circuit of claim 1 wherein the sensing circuit is disabled during operation of the output current calibration circuit.

13. The sensor integrated circuit of claim 1 wherein the bias voltage is equal to one-half of the supply voltage.

14. A method for generating a sensor output current at an output connection of a sensor integrated circuit, comprising:
applying a supply voltage to the sensor integrated circuit;
determining an offset current that corresponds to a bias voltage at the output connection equal to a fixed percentage of the supply voltage when a parameter current is substantially zero;
generating the parameter current proportional to a sensed parameter; and
providing the sensor output current at the output connection as a combination of the parameter current and the offset current.

15. The method of claim 14 wherein determining the offset current comprises:
dividing the supply voltage to generate a divided supply voltage corresponding to the fixed percentage of the supply voltage;
comparing the divided supply voltage to a voltage at the output connection to generate a difference voltage; and
generating the offset current based on the difference voltage.

16. The method of claim 14 further comprising coupling the output connection to a resistor external to the integrated circuit.

17. The method of claim 14 further comprising storing a setting indicative of the offset current.

18. The method of claim 17 further comprising checking a level of the parameter current and using the stored setting indicative of the offset current to generate the sensor output current if the parameter current is greater than a predetermined level.

19. The method of claim 14 further comprising storing information indicative of the supply voltage.

20. The method of claim 14 further comprising disabling the generation of the parameter current during the determination of the offset current.

21. The method of claim 14 wherein generating a parameter current comprises:
sensing the parameter with a sensing element to generate a sensor output signal;
amplifying the sensor output signal to generate an amplifier output signal; and
generating the parameter current with a voltage controlled current circuit based on the amplifier output signal.

22. The method of claim 21 wherein generating the parameter current with a voltage controlled current circuit comprises sourcing a current to the output connection or sinking a current from the output connection based on the amplifier output signal.

23. The method of claim 21 wherein sensing the parameter with a sensing element comprises sensing a magnetic field with a magnetic field sensing element.

24. The method of claim 23 wherein the magnetic field is generated by a current flow through a primary current conductor.

25. The method of claim 14 wherein the fixed percentage of the supply voltage is one-half.

* * * * *